United States Patent [19]

Rogerson et al.

[11] Patent Number: 5,035,035
[45] Date of Patent: Jul. 30, 1991

[54] METHOD OF MOUNTING SAW DEVICES

[75] Inventors: Stephen P. Rogerson, Woodbridge; Brian M. MacDonald, Felixstowe, both of England

[73] Assignee: British Telecommunications plc, London, England

[21] Appl. No.: 560,299

[22] Filed: Jul. 27, 1990

Related U.S. Application Data

[63] Continuation of Ser. No. 795,496, Dec. 13, 1985, abandoned.

[30] Foreign Application Priority Data

Feb. 20, 1984 [GB] United Kingdom ............... 8404398
Sep. 20, 1984 [GB] United Kingdom ............... 8423857

[51] Int. Cl.$^5$ ............................................. H05K 3/30
[52] U.S. Cl. ........................................ 29/25.35; 29/840; 228/180.2
[58] Field of Search ............... 29/25.35, 840; 228/180.2; 310/9.4, 313 R, 313 A, 348, 351

[56] References Cited

U.S. PATENT DOCUMENTS

| | | | |
|---|---|---|---|
| 3,353,263 | 11/1967 | Helms | 29/840 X |
| 3,457,639 | 7/1969 | Weller | 228/180.2 X |
| 3,612,922 | 10/1971 | Furnival | |
| 3,872,410 | 3/1975 | Zucker | |
| 3,885,173 | 5/1975 | Lee | 310/9.4 |
| 4,047,129 | 9/1977 | Ishiyama | |
| 4,266,157 | 5/1981 | Peters | |
| 4,329,613 | 5/1982 | Kinzel et al. | |
| 4,396,140 | 8/1983 | Jaffe et al. | 228/180.2 X |
| 4,409,567 | 10/1983 | Setsume et al. | 333/194 X |
| 4,420,652 | 10/1983 | Ikeno | |
| 4,450,377 | 5/1984 | Briese | |
| 4,494,033 | 1/1985 | Morse et al. | |

FOREIGN PATENT DOCUMENTS

| | | |
|---|---|---|
| 0057018 | 4/1982 | Japan |
| 0057020 | 4/1982 | Japan |
| 0063917 | 4/1982 | Japan |
| 0083421 | 4/1983 | Japan |
| 0133021 | 8/1983 | Japan |
| 0139513 | 8/1983 | Japan |
| 0139514 | 8/1983 | Japan |

Primary Examiner—Carl E. Hall
Attorney, Agent, or Firm—Nixon & Vanderhye

[57] ABSTRACT

A method of mounting a saw device comprising applying metallized areas to the surface of an appropriate substrate, attaching conductive leads to the metallized areas, locating the said surface adjacent a selected area of another substrate so that said leads contact conductive regions on the second substrate and attaching said leads to said conductive regions on the second substrate so that the first substrate is supported on the leads and the conductive regions.

13 Claims, 4 Drawing Sheets

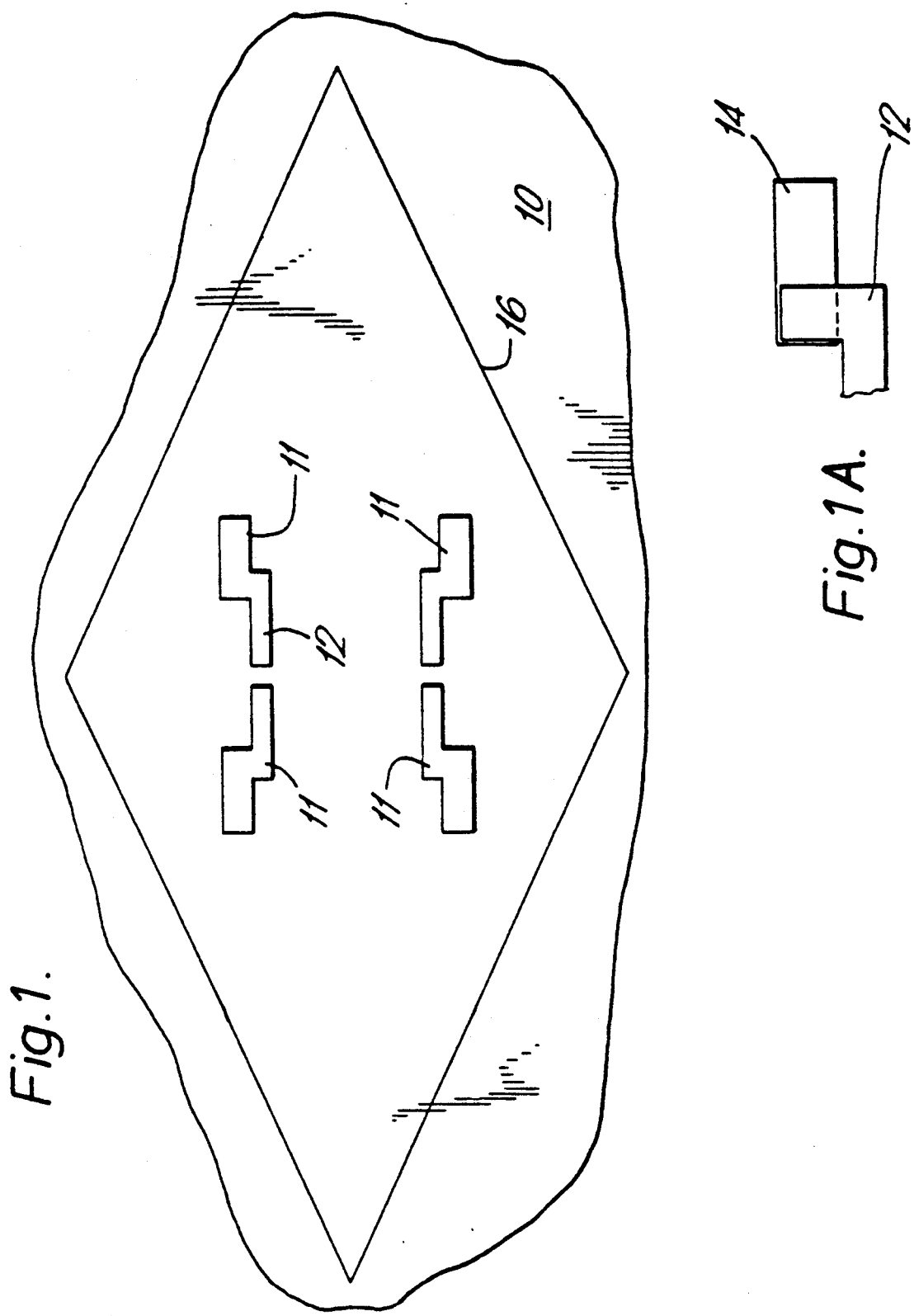

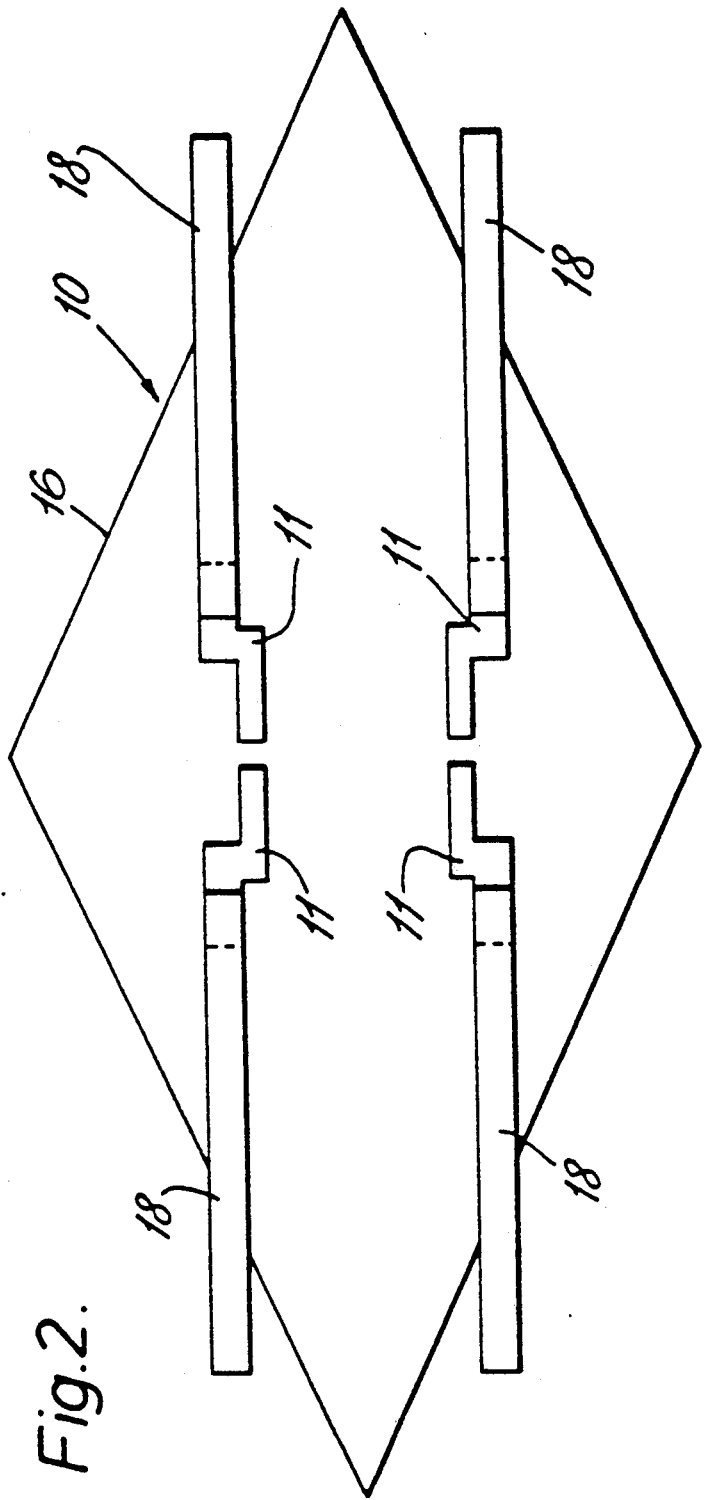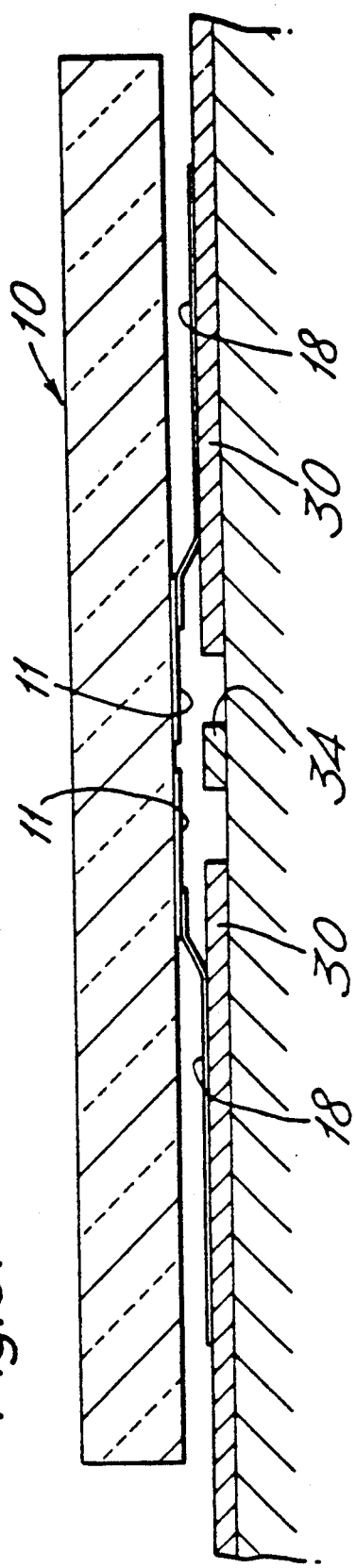

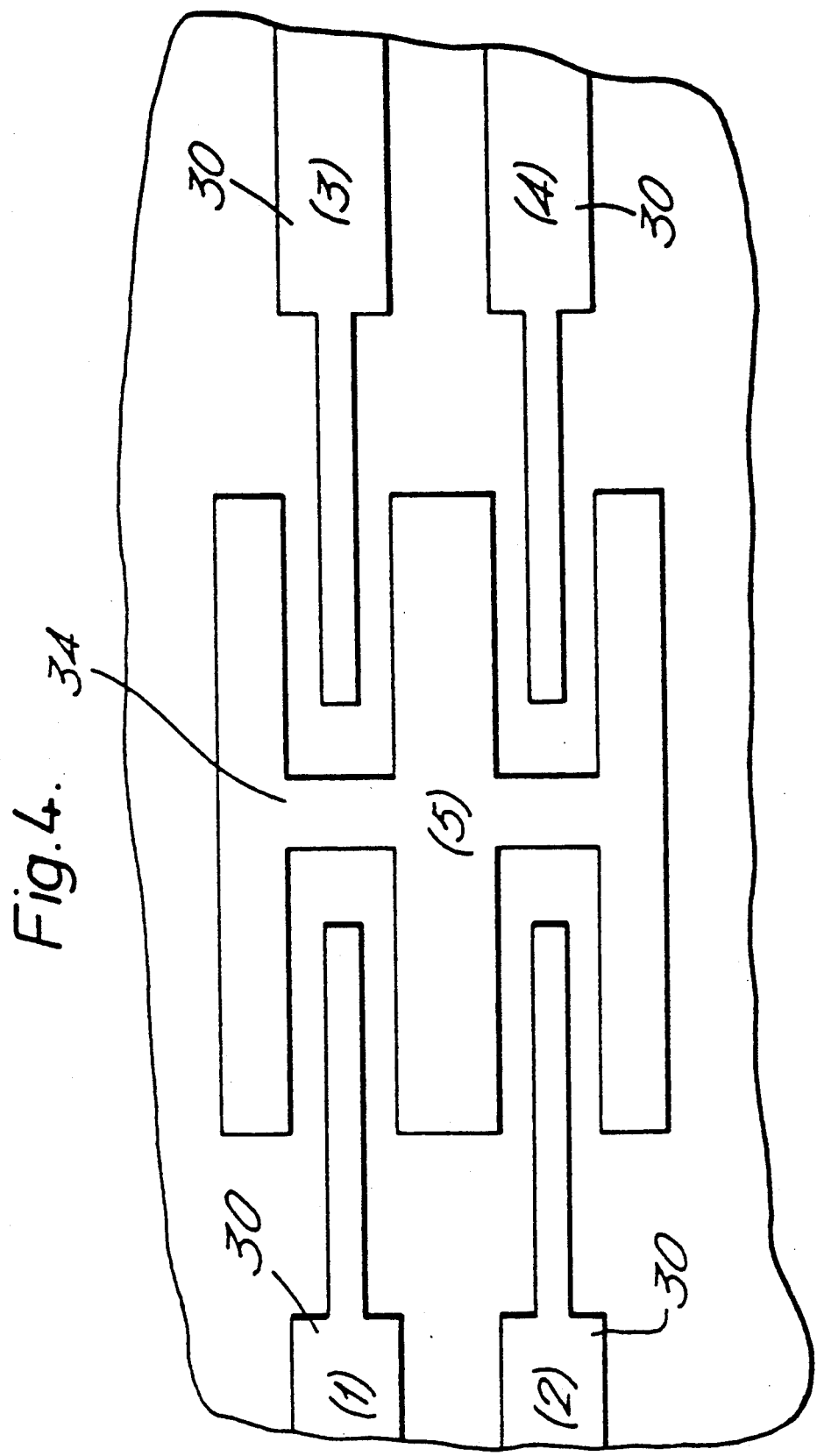

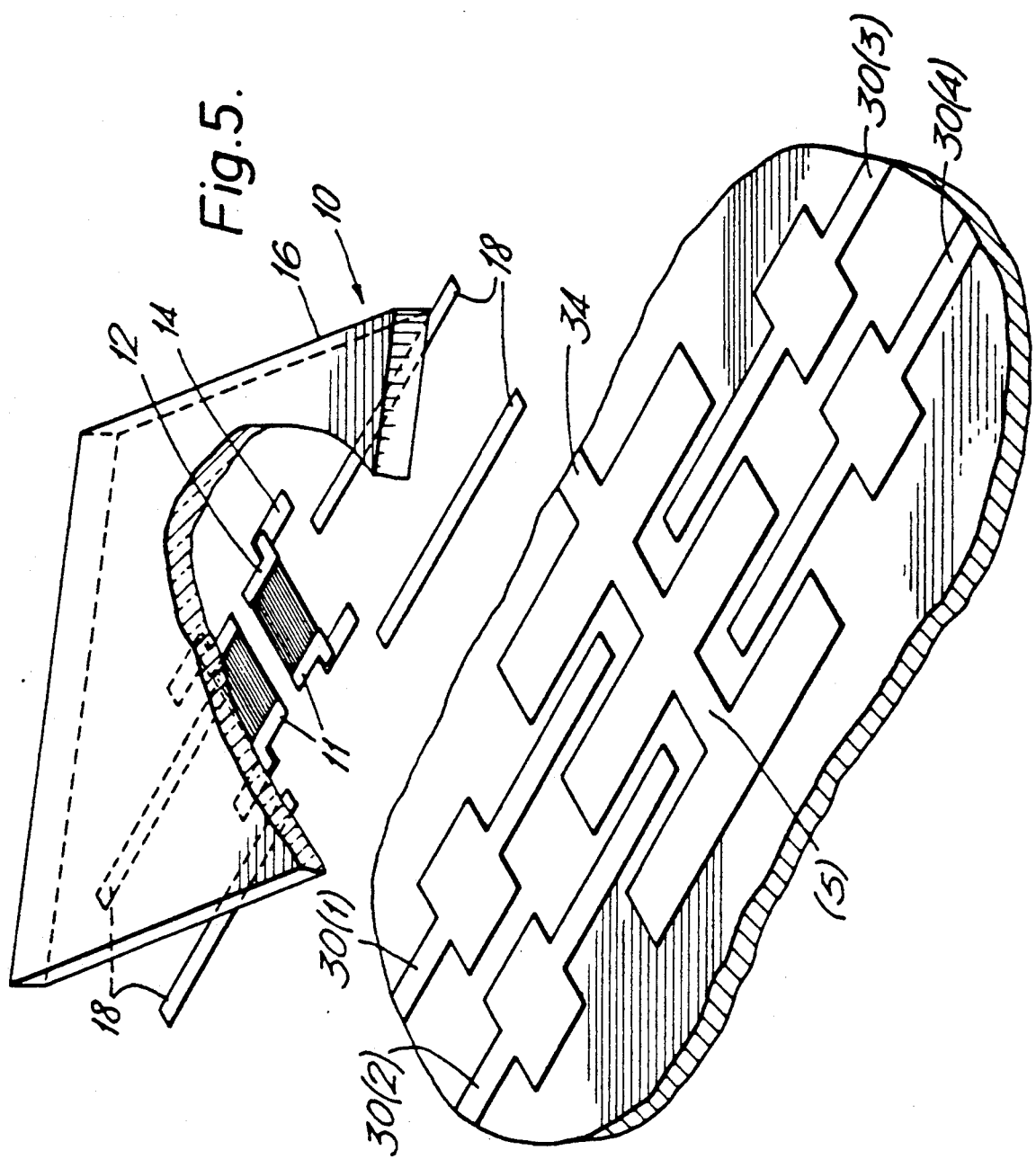

METHOD OF MOUNTING SAW DEVICES

This is a continuation of application Ser. No. 06/795,496, filed Dec. 13, 1985, now abandoned.

FIELD OF THE INVENTION

This invention relates to the method of mounting of surface acoustic wave (SAW) devices.

BACKGROUND OF THE INVENTION

SAW devices are used for example as bandpass filters in conjunction with electronic circuits. A typical known SAW device comprises a rectangular substrate of quartz on the surface of which are formed metal electrodes. These electrodes can be connected to a circuit by appropriate leads. The substrate is mounted upon a metal support to which it is bonded by an organic adhesive. The organic adhesive is usually formed round the end of the substrate to act as an acoustic absorber to reduce acoustic reflections from the end faces of the quartz. The use of metal mounted packages is not practical for thick film circuit boards with surface mounted components. It is possible to laser drill mounting holes in the thick film board for these metal packages but this is expensive. An alternative would be to mount the SAW device directly on the board using an organic adhesive. However, a problem with organic adhesive is that they emit gases, such as chlorine and water vapor, which can adversely affect the circuit with which the SAW device is being used as well as the device itself. For this reason in the past SAW devices has to be packages separately from the circuits with which thet are being used.

SUMMARY OF THE INVENTION

The present invention is concerned with a method for mounting SAW devices which does not make use of organic bonding agents and which allows the completed devices to be mounted directly onto a hybrid circuit.

According to one aspect of the present invention there is provided a method of mounting a SAW device comprising applying a metallized area of areas to the surface of an appropriate substrate, attaching conductive leads to the metallized areas, locating the said surface adjacent a selected area of another substrate so that said leads contact conductive regions on the second substrate and attaching said leads to said conductive regions on the second substrate so that the first substrate is supported on the leads and the conductive regions.

The method may include the steps of forming a plurality of said metallized areas on a piece of material suitable for forming SAW devices, and then cutting said material into individual devices prior to attachment to said leads.

A particularly advantageous shape for the SAW substrate has been found to be generally diamond shaped. If this shape is employed the need for an acoustic absorber at the ends of the device is avoided.

The leads can be attached to the metallized areas by thermo-compression bonding. The leads can also be attached to the conductive regions of the second substrate by thermo-compression bonding. The second substrate may be a hybrid circuit.

The metallization areas of the SAW substrate may include an aluminium layer and a gold layer. Preferably a titanium layer is formed between the aluminium and gold layers to prevent aluminium-gold interdiffusion.

The leads and the conductive regions on the second substrate may be formed from gold.

The SAW substrate may be formed from quartz.

The devices formed by the present method are particularly suitable for use with thick and thin film hybrid circuits. There is provided a hybrid circuit having a SAW device mounted thereon, said SAW device comprising a substrate, metallized areas on said substrate, and conductive leads attached to said areas, said circuit having formed thereon conductive regions, and said SAW device being mounted so that said conductive leads are located on and attached to said conductive regions.

There is provided a SAW device comprising a substrate, metallized areas on said substrate, and conductive leads attached to said metallized areas. Preferably the substrate is generally diamond shaped.

BRIEF DESCRIPTION OF THE DRAWINGS

The invention will be described now by was of example only with particular reference to the accompanying drawings. In the drawings:

FIG. 1 is a view illustrating the first stage in the method according to the present invention;

FIG. 2 is a plan view of an SAW device formed according to the present invention;

FIG. 3 is a side elevation showing an SAW device mounted on a substrate;

FIG. 4 is a plan view of a typical conductor pattern on a substrate;

FIG. 5 is a perspective schematic view, partly cut away, of the conductor pattern and SAW device prior to mounting on the substrate.

DETAILED DESCRIPTION

In the present method the first step is to form a plurality of metallized areas on the surface of a slab of quartz shown generally at 10. In FIG. 1 there is shown only an area corresponding substantially to a single SAW device but it will be appreciated that the slab 10 is considerably larger than the area shown so that metallized areas for several SAW devices can be formed at the same time. The metallized areas are shown at 11 in FIG. 1. Each metallized area comprise an L-shaped layer 12 formed of aluminium, and a rectangular layer 14 which partially over-lays one limb of the L-shaped and which is formed of gold. Preferably, a layer of titanium is formed intermediate the gold and aluminium to prevent gold-aluminium migration.

Having formed the metallized areas the slab of quartz is then cut up into individual devices. The shape of each individual device is illustrated by the line 16 in FIG. 1 and can be seen to be a diamond shape. Metal tapes are attached to the gold bonding areas on the surface of each device as shown in FIG. 2 of the drawings. The metal tapes are shown by reference numeral 18 and are attached to each gold bonding area by thermo-compression bonding as described below. Typical dimensions for each device can be seen on FIG. 1 of the drawings.

Referring now also to FIG. 5, each SAW device can then be mounted on a hybrid circuit board as follows. The device is inverted so that the surface to which the leads 18 have been attached is facing downwardly. The device is located over a hybrid circuit board which has a conductor pattern a shown in FIGS. 4 and 5 of the drawings. The device is placed upon the circuit board so that the leads 18 are supported on the conductive regions shown at 30. Referring also to FIG. 3 of the drawings it will be seen that the leads 18 are in face to face contact with the conductors 30 and are supported thereby. The leads 18 are attached to the conductors 30 by thermo-compression bonding to form the completed arrangement.

The present technique has a number of advanatges over the prior art. The diamond shape substrate can reduce end reflections without the need for providing any acoustic damping material at the ends of the substrate. The technique of using tape bonding to attach the device to the circuit board results in a low profile device and this helps in conjunction with the conductor arrangement shown in FIG. 4 to reduce electromagnetic breakthrough between SAW transducers. The tapes can be formed in such a way that no stress is transmitted from the hybrid substrate to the quartz substrate.

In the conductor arrangement shown in FIGS. 4 and 5 the area shown by reference numeral 34 is an earth shield which helps to reduce the electromagnetic breakthrough referred to above.

A majo feature of the present method is that it does not make use of any organic bonding agents in any form. Thus, the problem of out-gassing from such compounds does not occur and enables the SAW device to be mounted directly on the hybrid circuit board.

The mounting method also reduces the stresses applied to the quartz substrate during its operational life. In the prior art arrangement organic compound hold the SAW device in a rigid manner. This does not allow for thermal expansion of the substrate relative to the metal package. Such a problem is not so marked in the present arrangement. It will be noted particularly from FIG. 3 that the SAW substrate 10 is supported mainly at areas corresponding to the metallization areas 11. This provides a relatively stress-free mounting which should reduce the aging of the SAW device and possibly improve its long term reliability.

EXAMPLE

The saw filters fabricated by the present applicants are made on 1 mm thick, natural quartz cut in the ST plane. The interdigitated transducer are printed and etched in a 150 nm thick aluminium metallization using optical photoengraving techniques. The titanium/gold bond pads are defined on top of the aluminium fingers using a lift off process such as described, for example, by FRARY, J. M. and SESSE, P; 'Lift-off Techniques for Fine Line Metal Patterning', Semiconductor International, December 1981, pp. 72-88. The quartz is separated into individual devices by sawing completely through the substrate with a diamond blade. As mentioned above, in order to minimize the effect of edge reflections the quartz is sawn into diamond shape chips. Acoustic waves travelling towards the apexes of the chip are greatly damped by multiple reflections between the converging edges.

To mount the SAW chip gold tape leads are attached to the transducer bond pads and, as mentioned above, the chip is directly mounted face down onto the hybrid substrate.

Gold tape of 99.99% purity measuring 0.075 mm thick and 0.375 mm wide was used for the leads. Tape lengths of 3 mm were cut and then annealed in air for 15 minutes at 800° C. immediately before use. A Dage Precima die bonder, with a sharply pointed bonding tool of hard steel in place of the normal vacuum operated suction die collet, was used to attach the beam leads to the SAW chip. The leads were positioned with one end of each lead over each transducer bonding pad and a thermocompression bond was made using the 0.125 mm diameter tip of the bonding tool. The operation was carried out in dry nitrogen using a force of 0.6N and at a temperature of 250° C.

During bonding the leads distorted out of the plane of the quartz surface. Planarity was restored by placing the chip face downwards onto a clean polished glass surface and applying a small force to the back of the quartz.

The chip was then placed acoustic face down onto the hybrid, with the ends of the gold leads over the thick gold bonding lands. The hybrid was clamped to the heated chuck of the bonding machine and the leads bonded to the thick film, again using the pointed bonding tool that was used to attach the leads to the SAW chip. When these substrate bonds were made there was a tendency for the leads to cantilever. In order to prevent movement, a force was applied to the back of the chip whilst bonds were being made.

The transducers with titanium/gold bond pads were tested mechanically and gave gold lead pull strengths in excess of 0.5N and failure of these devices was due to lead breakage. In contrast, although gold leads could be bonded directly to aluminium bonding pads on the SAW chip, the pull strength of the leads was only a few grams and failure occured by the aluminium metal lifting from the quartz substrate. Assembled SAW devices with titanium/gold bond pads have been subjected to 1000 shocks at 2000 g and 1 minute vibration at 180 Hz (20 g amplitude) without failure.

Mounting the SAW devices by the method of the invention also offers improvements in the performance of the SAW devices. Firstly, the use of low profile bonding leads reduces electromagnetic breakthrough and secondly the earth plane of the thick film circuit can be positioned very close to the transducers to provide excellent screening. An overall improvement of 10 dB in the stopband rejection of SAW filters so mounted was achieved. The ripple introduced into the amplitude response was approximately +/−0.05 dB.

We claim:

1. A method of mounting a surface acoustic wave (SAW) device comprising a SAW propagating first substrate having a predetermined thickness, onto a second substrate having conductive contact regions thereon, said SAW device further comprising metallized areas including SAW transducer elements and connections bond pads disposed on one face of the SAW propagating first substrate; the method comprising the steps of:

attaching conductive leads to the connection bond pads;

positioning the device face down, over and in immediate proximity to the second substrate; and attaching the conductive leads to the conductive regions of the second substrate so that (a) the leads run substantially parallel to said face of the first substrate and (b) the first substrate is supported on the leads at a distance from the second substrate that is smaller than the predetermined thickness of said first substrate, whereby organic bonding agents need not be used to mount the SAW device onto the second substrate.

2. A method of mounting a surface acoustic wave (SAW) device comprising a SAW propagating first substrate having a predetermined thickness, onto a second substrate having conductive contact regions thereon, said SAW device further comprising metallized areas including SAW transducer elements and connection bond pads disposed on one face of the SAW propagating first substrate and conductive leads attached to said bond pads; the method comprising the steps of:

positioning the device face down, over and in immediate proximity to the second substrate; and attaching the conductive leads to the conductive regions of the seconds substrate, so that (a) the leads run substantially parallel to said face of the first substrate and (b) the first substrate is supported on the leads at a distance from the second substrate that is smaller than the predetermined thickness of said first substrate, whereby organic bonding agents need not be used to mount the SAW device onto the second substrate.

3. A method according to claim 1 comprising using gold tape to form the conductive leads.

4. A method according to claim 1 or claim 2 comprising positioning the device immediately above an earth shield region on said second substrate.

5. The method according to claim 1 or claim 2 comprising applying a compressive force on the device in the direction of the second substrate whilst attaching the leads to the conductive regions thereof, thereby to counteract any distortion of the leads.

6. A method a claimed in claim 1 including the step of forming a SAW substrate which is generally diamond shaped.

7. A method according to claim 1 including attaching the leads to the bonds pads by thermo-compression bonding.

8. A method according to claim 1 or claim 2 comprising attaching the leads to the conductive contact regions of the second substrate by thermo-compression bonding.

9. A method as claimed in claim 1 wherein the second substrate is a hybrid circuit.

10. A method as claimed in claim 1 wheren the metallized areas of the SAW substrate include an aluminium layer and a gold layer.

11. A method as claimed in claim 10 including formng a titanium layer between the aluminium and gold layers to prevent aluminium-gold interdiffusion.

12. A method as claimed in claim 1 including forming the leads and the conductive regions on the second substrate from gold.

13. A method as claimed in claim 1 including forming the SAW substrate from quartz.

* * * * *